United States Patent [19]
Johnston

[11] Patent Number: 5,667,410
[45] Date of Patent: Sep. 16, 1997

[54] ONE-PIECE COMPLIANT PROBE

[75] Inventor: Charles J. Johnston, Walnut, Calif.

[73] Assignee: Everett Charles Technologies, Inc., Pomona, Calif.

[21] Appl. No.: 561,395

[22] Filed: Nov. 21, 1995

[51] Int. Cl.⁶ .................................................. G01R 1/06
[52] U.S. Cl. ........................ 439/700; 324/761; 29/882
[58] Field of Search ............................. 439/482, 700, 439/824; 324/754, 761; 29/882

[56] References Cited

U.S. PATENT DOCUMENTS

| | | | |
|---|---|---|---|
| 4,307,928 | 12/1981 | Petlock, Jr. | 439/824 |
| 4,438,397 | 3/1984 | Katz | 324/761 |
| 4,773,877 | 9/1988 | Krüger et al. | 439/482 |

*Primary Examiner*—Neil Abrams
*Attorney, Agent, or Firm*—Christie, Parker & Hale, LLP

[57] ABSTRACT

A one-piece contact probe comprises a plunger member and a compliant spring section contained in and guided for spring biased axial travel in a tubular outer barrel, in which the plunger member, spring section and barrel are jointly formed of a single integral spring metal piece. In the process for making the compliant contact probe a thin bendable sheet metal piece is formed having a generally flat profile defining the plunger section, the spring section and the barrel section in that order along the integral spring metal piece. The plunger section and the integral spring section are bent from the generally flat profile into a generally tubular-shaped compliant plunger member. The barrel section is rounded from its generally flat profile into a curved profile which is then folded back over the compliant tubular plunger member after which bending of the barrel section is completed to form a generally tubular barrel disposed around the internal compliant plunger member. The process avoids the steps of separately manufacturing the compression spring, plunger and barrel of prior art multi-component spring probes and then assembling the individual components into the finished probe. The compliant contact probe of this invention can be used as a test probe (including for high current carrying applications) as well as a compliant connector.

25 Claims, 10 Drawing Sheets

FIG.2
FIG.3
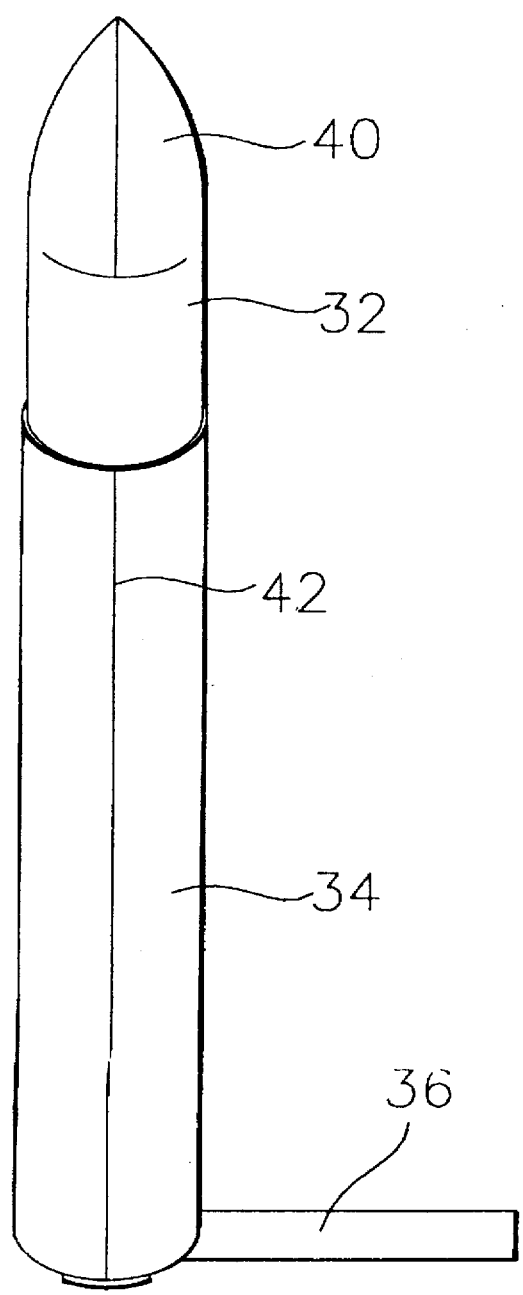
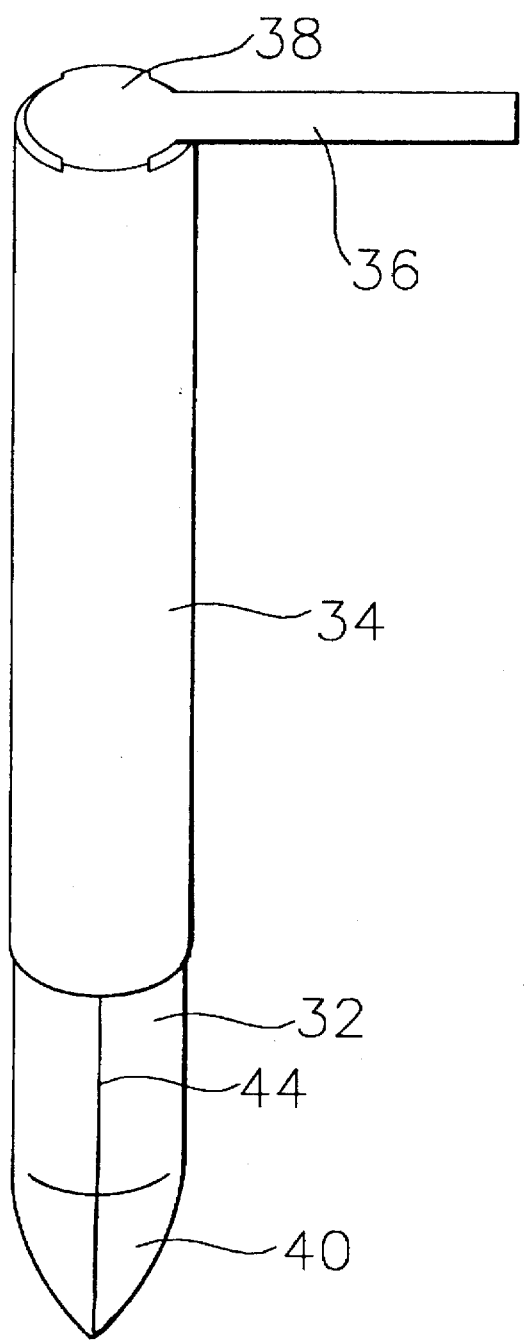

ONE-PIECE COMPLIANT PROBE

FIELD OF THE INVENTION

This invention relates to compliant electrical probes, and more particularly, to a one-piece compliant probe and a process for making the probe.

BACKGROUND OF THE INVENTION

The field of compliant electrical probes involves various designs of spring probes used in the automatic testing of printed circuit boards. In other instances a spring probe of roughly similar design can be used as a compliant connector for making releasable connections in electronic devices such as cellular phones or computers, for example.

In the automatic testing of electrical circuits, test probes of various configurations are used depending upon such factors as the type of electrical device under test, the spacing between test points, and the like. One type of prior art test probe includes a movable plunger mounted in a tubular barrel with the probe end of the plunger extending outwardly from the barrel. A compression spring in the barrel supports the plunger for spring-biased axial travel within the barrel. The plunger is spaced outwardly a selected distance by the spring and may be biased inwardly into the barrel a selected distance under a force directed against the spring. The probe plunger has a probe tip designed with various configurations for making contact with selected test points on the electrical device under test.

The process of making a conventional spring probe involves separately producing the compression spring, the barrel and the plunger. The compression spring is wound and heat treated to produce a spring of a precise size and of a controlled spring force. The plunger is typically heat treated and sometimes the barrels are heat treated. All components are subjected to a plating process to enhance conductivity. The spring probe components are assembled either manually or by an automated process. During assembly, the compression spring is first placed in the barrel, the plunger is then inserted into the barrel to compress the spring, and the barrel is roll crimped to retain the plunger. In use, the completed spring probes are commonly inserted into an outer receptacle for retaining the probe in a fixture or the like. The principal cost factors in producing these multi-component probes are the separate manufacturing costs of the components and the assembly time and equipment for producing the finished part.

U.S. Pat. No. 4,773,877 to Krüger et al. discloses a contact probe for an electronic tester in which the probe includes a one-piece resilient contact pin having a guided plunger at one end and a spring section at the other end. The approach taken in the Krüger '877 patent is intended to reduce spring probe production costs. The plunger section and spring section are integrally joined and formed from a common sheet metal piece. The particular form of the contact probe shown in the Krüger '877 patent would not be useful as an electrical connector for carrying high loads subjected to constant cycling. The Krüger contact probe also would not be useful for high density spring contacts in a miniaturized connector adapted for mounting to a printed circuit board and also subjected to constant cycling.

The present invention overcomes the drawbacks of the Krüger '877 contact probe by providing a solid metal compliant high current carrying electrical connector and, in one form of the invention, by providing solid metal compliant contacts for several forms of miniaturized connectors adapted for mounting to printed circuit boards.

The present invention also provides a unique process for making a one-piece compliant electrical probe with greatly reduced production costs. The costs involved in producing the separate components of traditional spring probes and assembling them into a workable unit are eliminated. In addition, certain functional improvements are provided, including lowering the electrical resistance of the probe, which produces improved capacity for high current carrying applications. The invention also is useful in applications either as a test probe, a compliant connector, or a switch probe.

SUMMARY OF THE INVENTION

Briefly, one embodiment of the invention comprises a one-piece contact probe comprising a plunger member and a compliant spring section contained in and guided for spring-biased axial travel in a tubular outer barrel, in which the plunger member, spring section and barrel are jointly formed of a single integral spring metal piece.

A preferred process for manufacturing the one-piece contact probe comprises starting with a thin, bendable spring metal piece having a predetermined profile defining a plunger section, a spring section and a barrel section. The spring metal piece can be made previously from strip stock by a die stamping process or by a chemical etching process, for example. The barrel section is rounded by bending it, such as by a die process, and the plunger section and spring section also are rounded by bending them in unison, also by a die process. The plunger and spring sections are preferably rounded into generally tubular shapes in a progressive die process, with the rounded barrel section then being folded over the plunger and spring sections, followed by completing a tubular form of the barrel as to a cylindrical body confining the tubular-shaped spring section and plunger section. The result is a one-piece compliant connector having an outer barrel of tubular configuration confining within its interior the tubularly formed compliant spring section and plunger section, in which the spring section provides a compliant means of biasing the plunger section for axial travel within the tubular outer barrel.

In one form of the invention, an elongated terminal member integrally formed with the same spring metal piece projects outwardly from the outer barrel for providing a means of electrical connection to an external electrical conductor. In one embodiment, the finished compliant probe can be used as a conductive element of an electrical connector in which the probe end of the compliant connector protrudes from one end of the connector housing, and the integral terminal member projects from the other end of the housing for connection to a PCB or the like.

A flat-form profile of the integral spring metal piece is initially plated with a conductive metal, and preferably following forming with the progressive die steps, the completed piece is heat treated. The metal piece in its non-heat-treated condition is therefore more readily bendable into the desired component configurations.

The invention avoids the conventional practice of producing a barrel, a plunger and a compression spring as three different components and then assembling them into a finished part. In the present invention these traditional components are made as a single metal piece preferably made in flat form by a high speed metal stamping process. The bending, folding and finish-bending steps save time and equipment costs when compared with conventional assembly and equipment costs.

These and other aspects of the invention will be more fully understood by referring to the following detailed description and the accompanying drawings.

DETAILED DESCRIPTION OF THE DRAWINGS

FIG. 2 is a perspective view illustrating a completed one-piece compliant connector probe according to principles of this invention.

FIG. 3 is a perspective view of the probe shown in FIG. 2 taken from the right side of FIG. 2.

DETAILED DESCRIPTION

Figure 1:
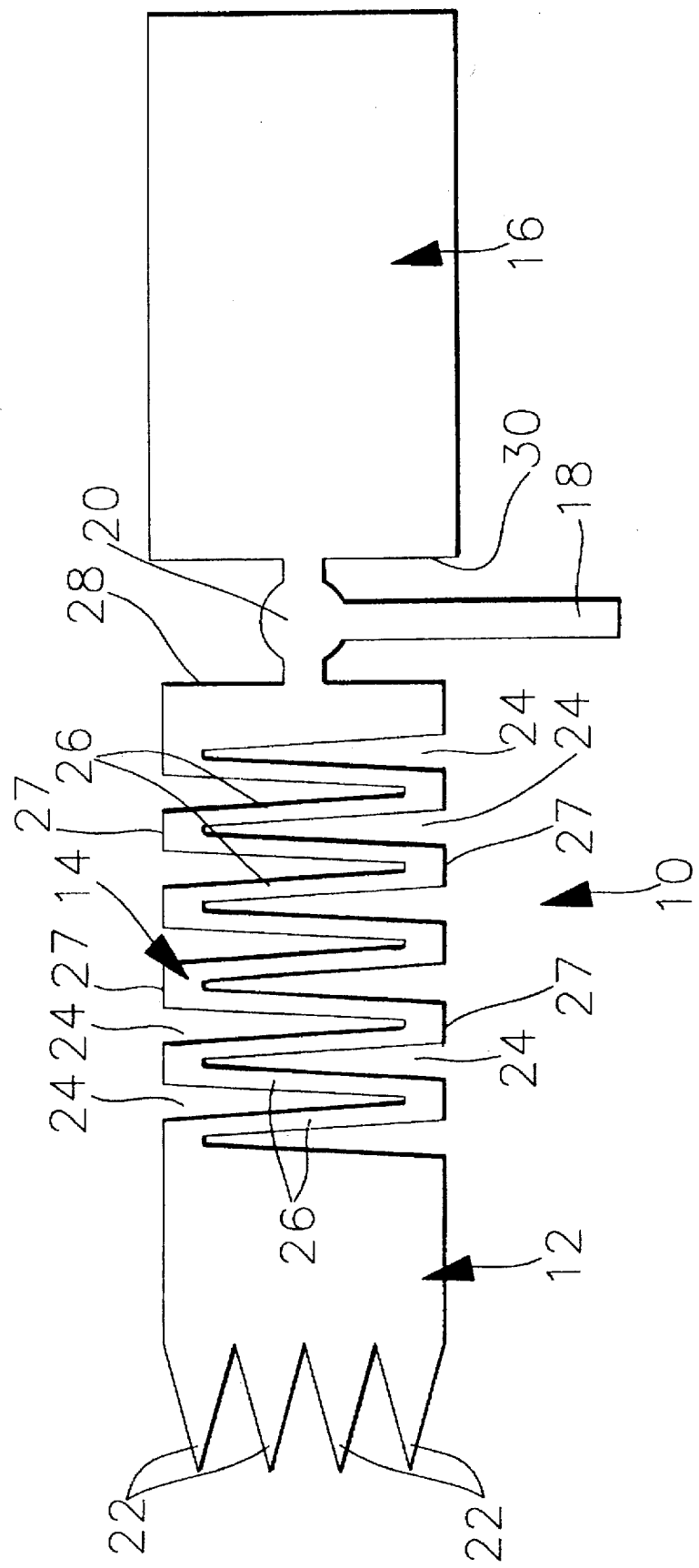
FIG. 1 is a flat form profile of a single integral metal piece used for making a one-piece connector according to principles of this invention.

FIG. 1 shows a thin, flat spring metal piece 10 shaped in a profile to define a plunger section 12 joined to a spring section 14 joined to a barrel section 16, in that order. An elongated narrow terminal member 18 is integrally joined to a rounded cap section 20 of the spring metal piece located between the spring section and the barrel section. The narrow terminal member projects outwardly from one side of the spring metal piece beyond the outer edge of the barrel section and the spring section.

The plunger section, spring section, barrel section, terminal member and cap section are integrally joined together as a single one-piece unit. The flat form of the spring metal piece shown in FIG. 1 is referred to as an initial profile and is preferably shaped by a high speed metal stamping process, although it also can be formed by a chemical etching process.

The plunger section 12 is generally rectangular in shape and preferably has a series of pointed ends 22 of uniform size and shape, uniformly spaced along an axis generally perpendicular to the longitudinal axis of the spring metal piece.

The spring section 14 has a generally rectangular outer profile matching the rectangular outer profile of the adjacent plunger section. The spring section is formed by a series of long, narrow V-shaped slots 24 alternately opening to opposite sides of the spring section in a direction lengthwise with respect to the main axis of the spring metal piece. In the illustrated embodiment there are a total of ten alternating V-shaped slots 24 that form a zigzag-shaped continuous spring member that defines a series of long, narrow beams 26 of generally uniform width spaced along the spring section. The spring section has flat outer edges 27 aligned along opposite sides of the spring section and spaced from the inner end of each V-shaped slot 24. The length of each slot is substantially greater than the beam width, and the depth of each slot extends at least 75% and preferably 80–90% of the width across the rectangular spring section. The thickness of each narrow beam is less than about 10%, and more preferably less than about 5%, the width of the spring section. The beams 26 are of uniform length and of uniform thickness. Under a compression force, the long narrow profile beams individually deflect to cause the spring section to compress under an axial force. The narrow profile of each beam is formed by the narrow slot adjacent the beam having a depth substantially greater than the thickness of the beams on opposite sides of the slot, with the beams individually deflecting through shallow angles about respective pivot points alternating in position along the length of the spring section when the spring section is compressed by the axial force. In use, the initial flat form profile of the spring metal piece shown in FIG. 1 is not actually subjected to such an axial force, but this description generally suffices to describe the relative dimensions and function of the thin, flat form of the spring section of FIG. 1 prior to subjecting the spring metal piece to further shaping according to the process of this invention.

The rounded cap section 20 is located generally equidistantly between an inner edge 28 of the spring section and an adjacent inner edge 30 of the barrel section. The cap section is circularly curved with a diameter slightly less than the diameter of a circularly curved cylinder formed by the rectangular barrel section 16 when the barrel is shaped according to the process described below.

The terminal member 18 is generally rectangular in shape and of long narrow profile and projects outwardly from the profile perpendicularly to the main axis of the spring metal piece.

The barrel section 16 is of generally rectangular profile and has a length shorter than the overall length of the spring section and its integral plunger section. The width of the barrel section is slightly greater than the overall width of the spring section and its integral plunger section.

The spring metal piece of FIG. 1 is subjected to a progressive die operation involving a series of metal bending steps that form the initial flat profile into a finished one-piece spring contact probe. FIGS. 2 and 3 illustrate two views of the finished spring probe in which a compliant plunger section 32 protrudes from an end of an elongated cylindrical outer barrel 34. A terminal leg 36 projects outwardly from a rounded end cap 38 which substantially closes one end of the barrel opposite from the plunger. The plunger has a pointed contact tip 40. The compliant plunger is movable for reciprocating axial travel in the barrel guided by the inside diameter of the barrel which closely surrounds the outside diameter of the compliant plunger. The plunger travels axially into the barrel under an external contact force applied to the tip of the plunger moving against an opposing spring force applied by an internal spring section of the plunger. The plunger is movable axially out of the barrel under the spring-biasing force of the spring section when the external axial contact force is released. FIG. 2 illustrates a long axial seam 42 of the closed barrel section 34 running the length of the barrel. FIG. 3 illustrates an axial seam 44 of the compliant plunger section running the length of the compliant plunger.

Figure 4:
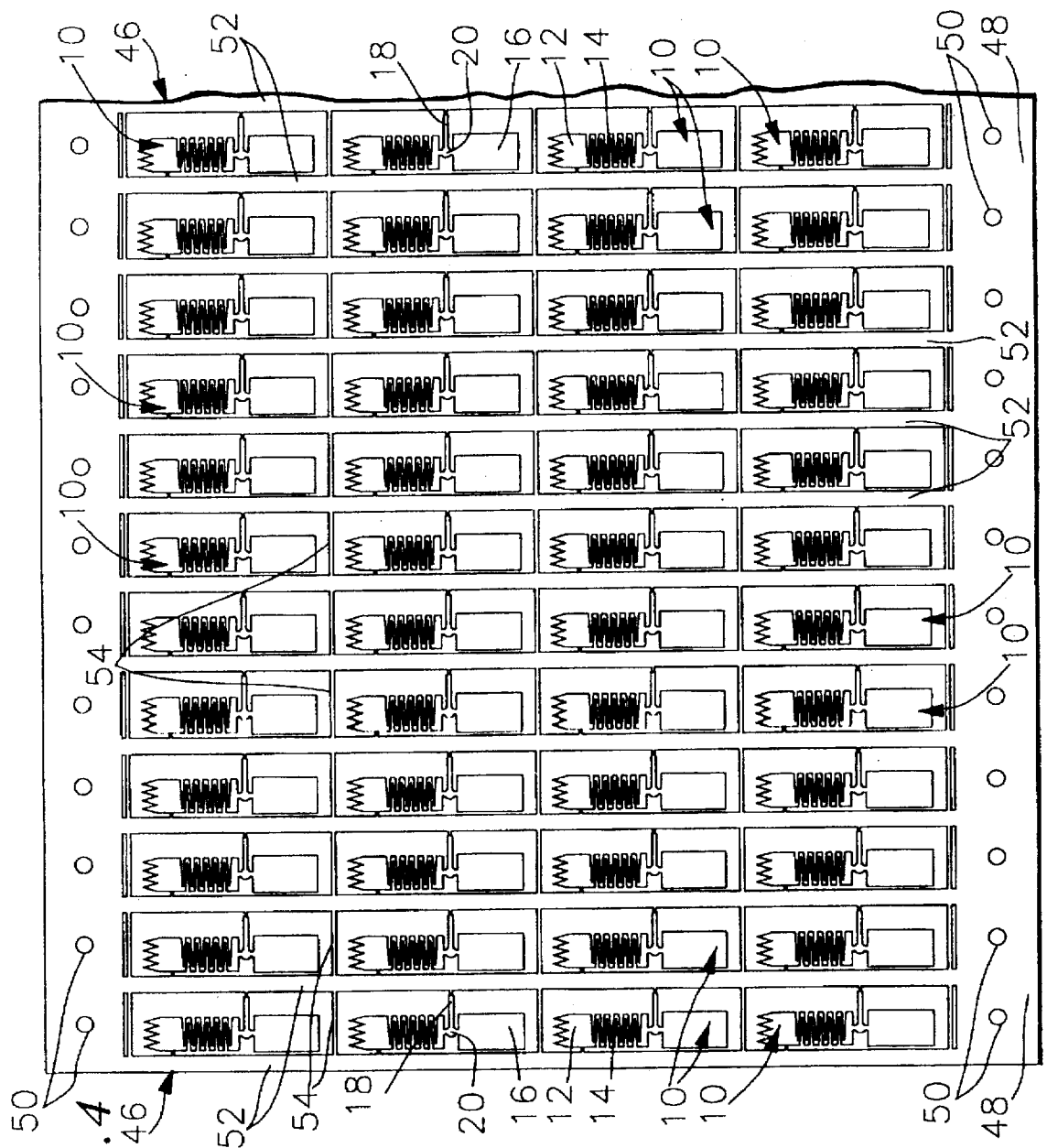
FIG. 4 is a fragmentary elevational view illustrating an array of flat-form profile connector probe elements connected to a lead frame.

FIGS. 4 through 8 illustrate a sequence of steps in the process of making the contact probe. FIG. 4 illustrates an initial step in the process in which an array of flat form one-piece spring metal profiles 10 similar in configuration to the profile of FIG. 1 are formed in rows and columns on a thin, flat flexible spring metal sheet 46. The array of spring metal profiles is contained within a rectangular outer lead frame 48. The profiles are preferably joined together as a single integral unit within the rectangular outer profile which can also include a series of spaced-apart sprocket holes 50 along opposite edges of the lead frame. The profiled spring metal sheet shown in FIG. 4 is preferably made by a high speed metal stamping process, although as mentioned previously, a chemical etching process also can be used.

In the preferred arrangement the spring metal profiles are oriented in the same direction on the sheet 46 with the plunger section 12, spring section 14 and barrel section 16 of each profile extending (in that order) along parallel rows of the array of profiles. Opposite sides of each profile are joined to parallel frame sections 52 of the flexible metal sheet 46. The frame sections 52 separate the profiles into parallel columns on the flexible sheet. One side of each profile is joined to a parallel frame section 52 via the terminal member 18 of each spring metal profile. The ends of the profiles are joined to parallel tie bars 54 of the flexible metal sheet. The tie bars 54 separate the profiles into parallel rows on the flexible sheet.

The sprocket holes 50 on the outer opposite edges of the lead frame can be used for reel-to-reel automated plating, die bending, heat-treating and assembly of the finished spring probes into connector housings as described in more detail below.

Figure 5:
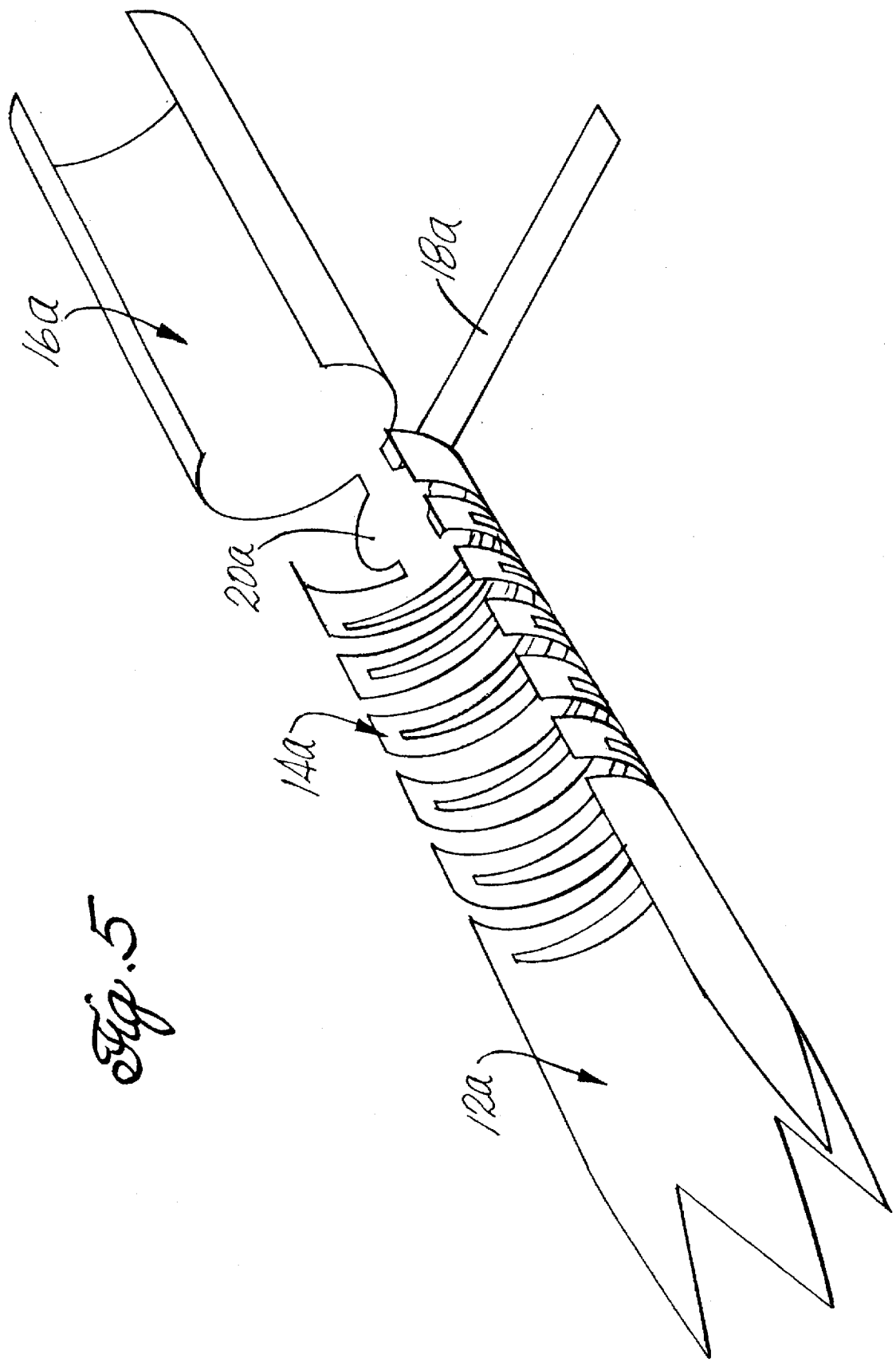
FIG. 5 is a perspective view illustrating an initial step in a process of forming the profile into a rounded configuration in one of several progressive die steps.

The flat initial spring metal profiles shown in FIG. 4 are shaped by a progressive metal die bending process to form each profile into a rounded cylindrically curved shape. These progressive die steps are carried out for bending the profile about its longitudinal axis while the individual profiles that are being bent by the die process remain attached to the flexible lead frame sheet 46 shown in FIG. 4. As an initial step in the progression of die bending steps, the spring section and the plunger at one end of the profile are bent into a circularly curved shape and the barrel section at the opposite end of the profile is bent into a similar circularly curved form shown in FIG. 5. This produces a rounded, cylindrically curved probe section 12a and spring section 14a as shown in FIG. 5, with a similarly curved barrel section 16a. The cap section 20a and terminal member 18a remain flat.

Figure 6:
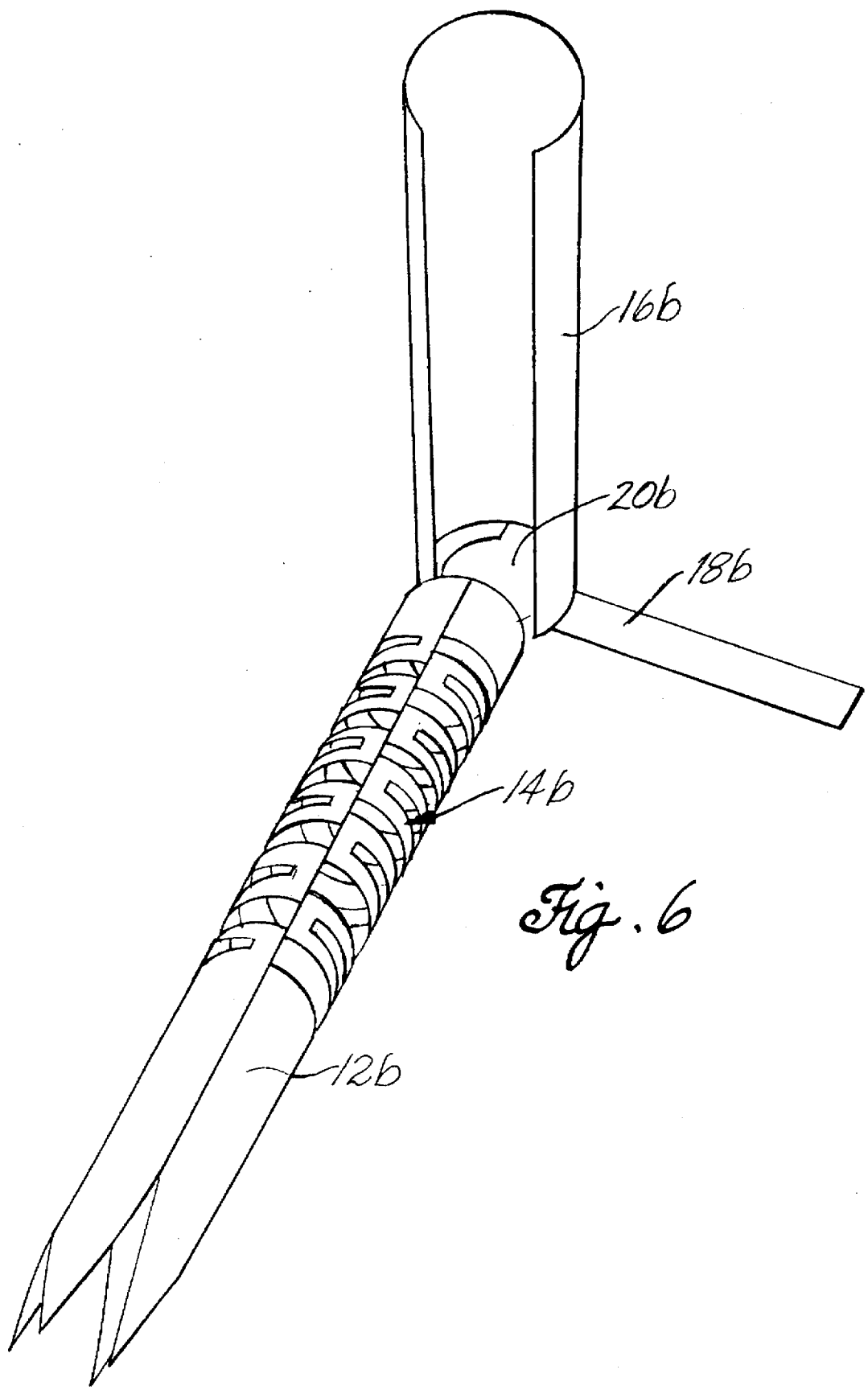
FIG. 6 is a perspective view illustrating a further step in the process of forming the plunger and spring sections of the metal piece and folding over a formed section of the barrel.

The metal profiles are subjected to continued die bending until the integral spring section and plunger section are completely bent into the rounded tubular form shown in FIG. 6 which produces a spring-biased plunger member of closed tubular cylindrically shaped form. The plunger member has a tubular spring section 14b and plunger section 12b. At the opposite end of the profile the cylindrically shaped barrel 16b is attached to the flat end cap section 20b. The rounded barrel section 16b is then folded over the previously formed tubular compliant plunger member, followed by finish bending the barrel section around the compliant plunger member to a closed tubular outer barrel 16c shown in FIG. 7. This produces a compliant probe in which the compliant plunger member is enclosed within the outer barrel 16c. In this form of the invention the cap section 20c is integrally positioned in flat form at the end of the closed cylinder substantially closing the end of the barrel, with the terminal member 18c projecting from the same end of the completed cylinder. A spring biased plunger member 12c protrudes from the opposite end of the barrel.

Figure 7:
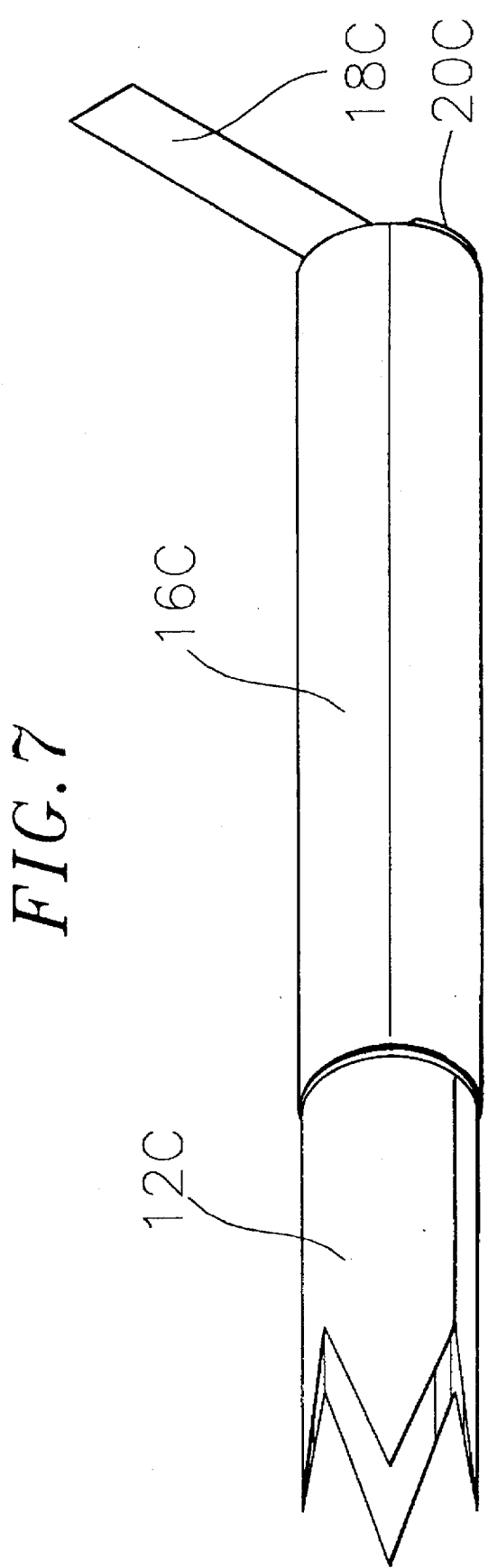
FIG. 7 is a perspective view illustrating a further step in the process in which the barrel has been folded over and formed to produce a closed seam along one side of the barrel.

The completed one-piece compliant probes in the form shown in FIG. 7 each form a one-piece contact probe comprising a plunger member and a compliant spring section contained in and guided for spring-biased axial travel in the tubular outer barrel. The tubular spring section beams 26 form a resilient compression spring attached to the cap section and freely biasing the plunger section of the probe for compliant axial travel in the barrel. The plunger member, spring section and the barrel are jointly formed by the single integral spring metal piece. In addition, the elongated terminal member is integrally formed of the same spring metal piece and is joined to the completed spring probes so as to project outwardly from the barrel. The terminal member provides a means of electrical contact to an external electrical conductor such as that described in more detail below. In addition, the cap section 20c which is integrally formed with the same spring metal piece and is joined to it between the spring section and barrel section is positioned to form a closed end of the finished cylinder with the terminal member projecting away from the end cap. These completed one-piece compliant probes remain attached to the lead frame sheet 46 shown in FIG. 4 throughout the progressive die bending steps and are joined to the frame sections 52 of the lead frame sheet by attachment through the terminal members of the individually formed one-piece compliant probes.

The completed spring probes are heat treated to enhance tensile strength of the components after they are formed.

Figure 8:
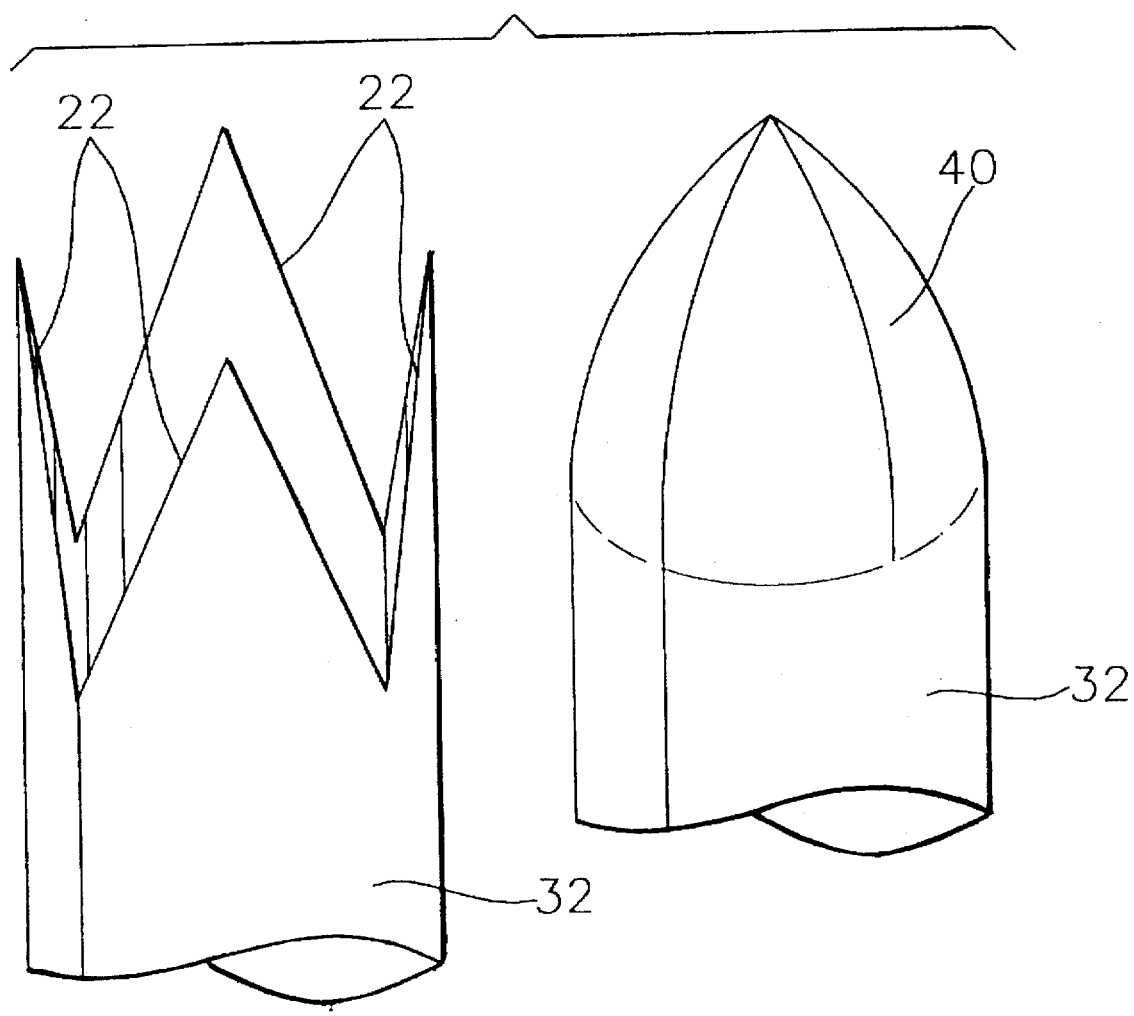
FIG. 8 is a perspective view illustrating a process of folding in projections on a probe section for forming a particular pointed style tip of the plunger.

FIG. 8 illustrates an optional process step in which the tip portion of the plunger section can be formed into various tip configurations depending upon the ultimate application of the compliant probe. FIG. 8 illustrates two forms of the invention in which the rounded plunger section can have the pointed tip sections 22 remaining as four separate projections at the tip of the plunger, or the tip sections of the plunger can be bent over to form four separate quadrants of a pointed tip 40 at the end of the plunger section 32.

Figure 9:
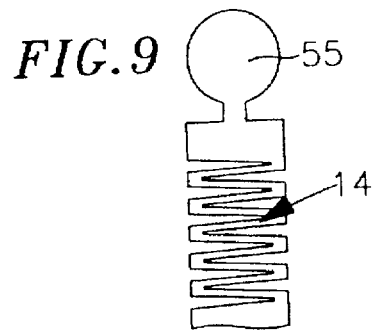
FIG. 9 is a fragmentary elevational view showing an alternative configuration of a probe end of the connector.

FIG. 9 illustrates a further alternative probe tip configuration. In this embodiment a rounded, hemispherical tip is formed at the end of the finished probe. FIG. 9 illustrates a step in the process for making the rounded tip in which a probe tip section 55 is initially formed in a circular configuration which is then die stamped into a dish-shaped configuration, followed by die forming the finished tip in a dome-shaped or hemispherical configuration. The dome-shaped tip end can be used in applications such as connectors for batteries or cellular phone contacts.

In the preferred embodiment of the invention the metal profile shown in FIG. 1 is made from a 0.008 inch thick beryllium copper spring metal sheet with the following dimensions. The plunger section and spring section are 0.210 inch long. The width of the barrel section is 0.23 inch and the length of the barrel section is 0.390 inch. The cap section has a diameter of 0.065 inch and the terminal member is 0.205 inch long with a width of 0.030 inch. The length of the combined spring section and barrel section is 0.589 inch and the entire length of the flat form profile is 1.082 inch. The spacing between the spring member and the barrel section is approximately 0.100 inch.

Figure 10:
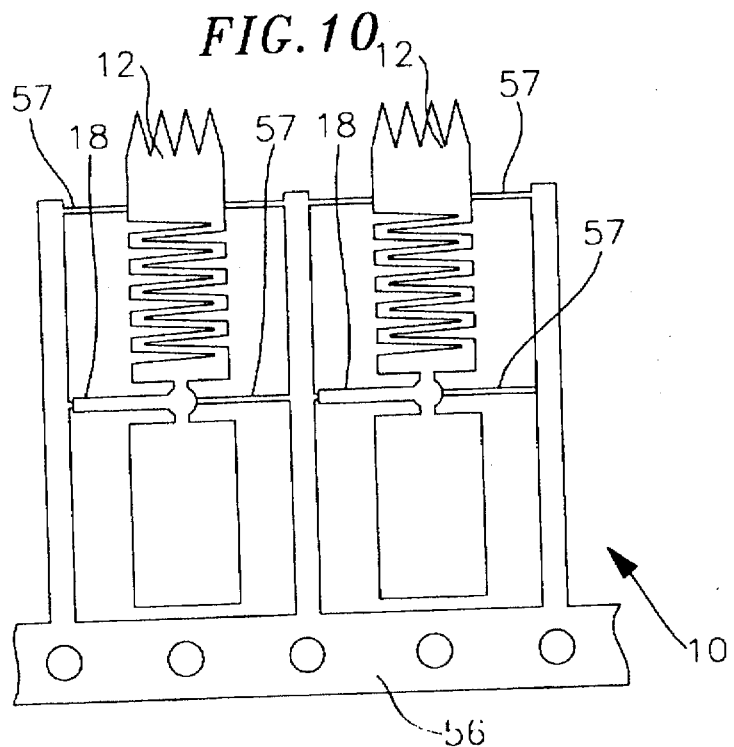
FIG. 10 is a fragmentary elevational view illustrating an alternative embodiment of a flat-form profile connector probe configuration.

FIG. 10 is an embodiment of a flexible spring metal sheet which can be an alternative to the sheet 46 of FIG. 4. In the FIG. 10 embodiment the spring metal profiles for each probe are identical to the profiles shown in FIG. 4, but the profiles are arranged differently within an outer lead frame 56. The spring metal profiles are aligned in a row, each carried in a recessed region supported therein by tie bars 57 in addition to the terminal members 18. The plunger sections 12 and end tip configurations are exposed at the ends of the recessed regions. This arrangement more easily allows the profiles to be initially plated in their entirety by a conductive material such as a nickel-palladium alloy, followed by plating only the exposed plunger sections and tip regions with a more expensive conductive metal such as gold.

Figure 11:
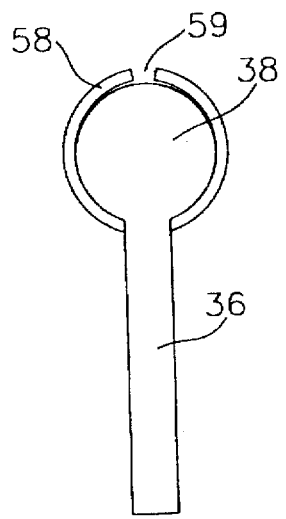
FIG. 11 is an end elevational view of a completed connector showing an alternative barrel configuration.

FIG. 11 illustrates an embodiment of the invention in which an alternative barrel section 58 of the finished probe has a narrow gap 59 along the region of the barrel where the seam 42 (described previously) is normally located. In the die process for finish-shaping the barrel, the narrow gap is left in the barrel, followed by the heat-treating step. The narrow permanent gap can then function as a spring-biased retention means when the finished probe or connector is inserted into a smaller-diameter hole or receptacle during use. When the barrel is inserted in a smaller-diameter hole, such as a plated thru-hole, the spring metal barrel will close inwardly along the gap region and naturally apply an outward spring biased retention force retaining the probe in the thru-hole without the need for an additional hole retention means.

Figure 12:
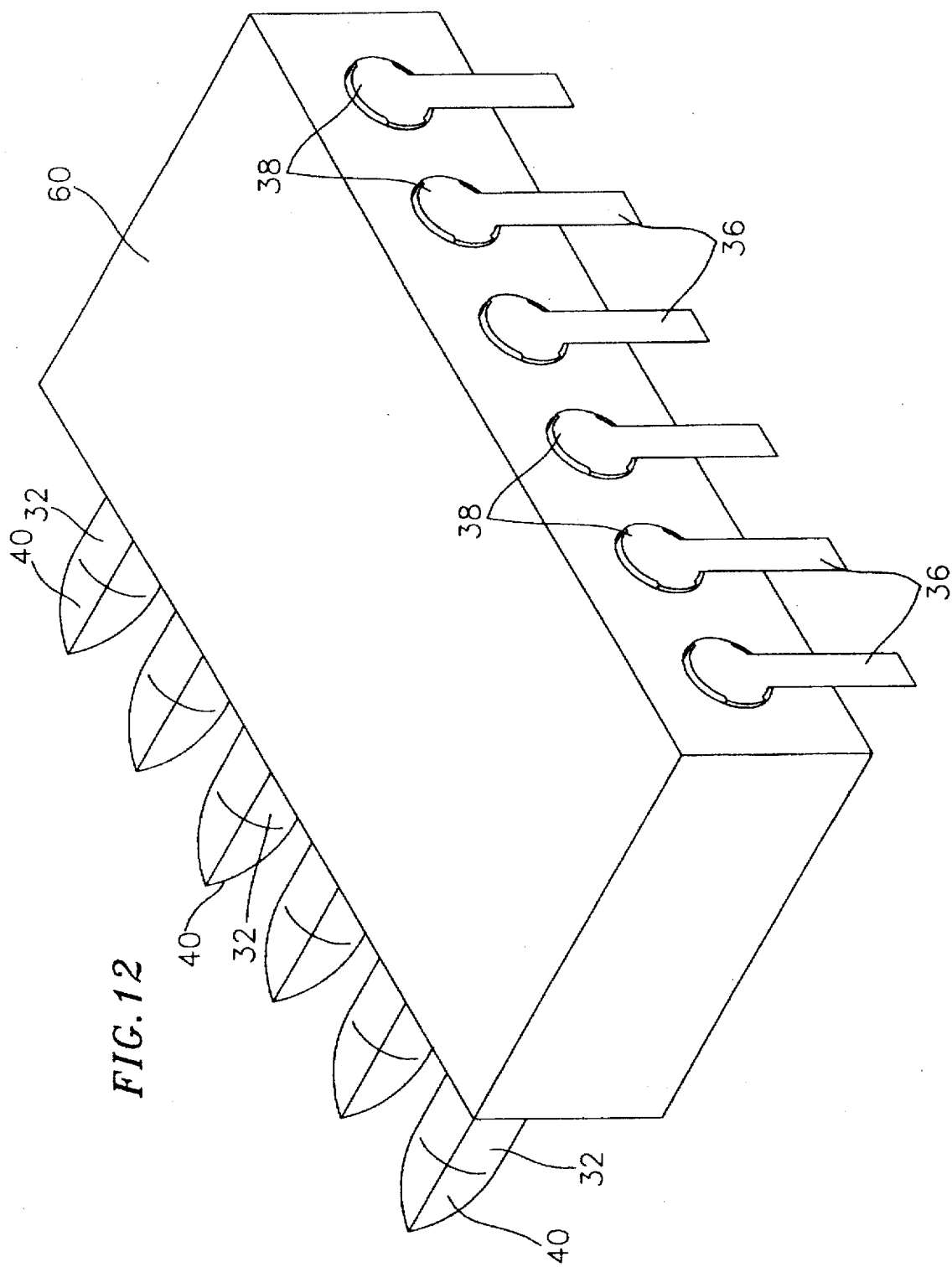
FIG. 12 is a perspective view illustrating an electrical connector containing one-piece compliant probes according to principles of this invention.

FIG. 12 illustrates one embodiment of the invention in which the compliant spring probes are used as compliant connector probes in an electrical connector. The connector includes a housing 60 with parallel spaced apart passages each containing a separate spring probe. The probes are aligned in the connector housing so that the spring-biased plunger sections 32 of the probes project outwardly from one side of the connector, with the terminal members 36 of the spring probes projecting from the opposite side of the connector housing. The terminal ends 36 of the compliant probes are connected to separate electrical conductors such as the electrical conductors on a printed circuit board. The compliant probe ends 40 of the connectors are used for making spring biased electrical connections to corresponding spring contacts in a device to which the housing is connected. The connector illustrated in FIG. 9 can be used for releasable spring contact type electrical connections for cellular phones, computers or the like.

Figure 13:
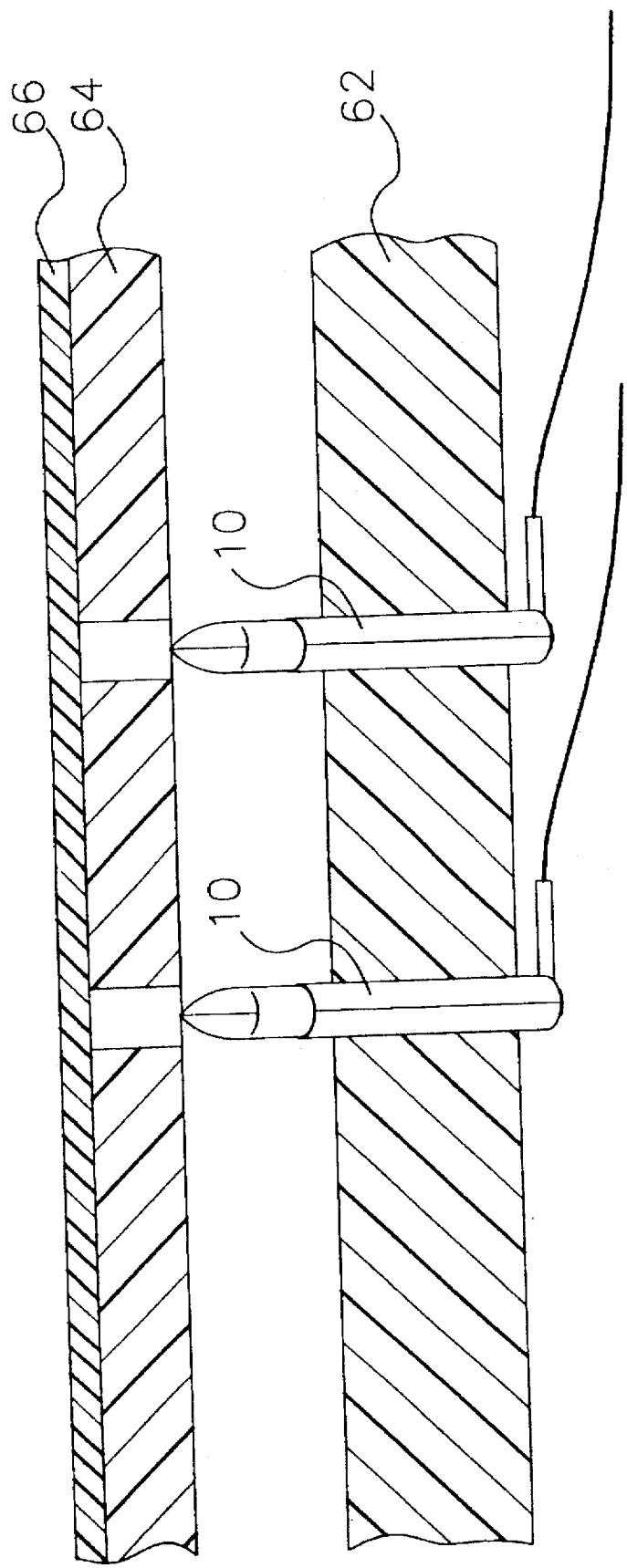
FIG. 13 is a side elevational view illustrating use of the compliant spring probe as a test probe in a test fixture.

FIG. 13 illustrates another embodiment of the invention in which the compliant spring probes 10 of this invention are used as test probes in a test fixture used in automatic electronic test equipment for testing electrical continuity in circuits on a printed circuit board. In this embodiment the barrel of the connector is mounted to a probe plate 62 of the test fixture, and a movable upper plate 64 mounts a printed circuit board 66 above the spring probes. The terminal members of the test probes are wired to test circuitry in the well known manner. During use and under an externally applied force, the spring probes are held in releasable spring pressure contact with test points on the board under test.

Thus, the invention provides a method for making a one-piece compliant probe which reduces production costs by eliminating the separate manufacturing and assembly steps for making conventional spring probes. The new compliant probe also greatly reduces electrical resistance developed by the probe. The bending of the metal one-piece probe causes the probe spring section to automatically travel in the barrel with a small sideways force that produces continuous sliding mechanical contact (and therefore continuous electrical contact) between the plunger member and the barrel. One test revealed a probe resistance of 0.005 ohm compared with a resistance of 0.010–0.015 ohm for a conventional spring probe.

What is claimed is:

1. A one-piece contact probe comprising a plunger member and a compliant spring section contained in and guided for spring biased axial travel in a tubular outer barrel, in which the plunger member, spring section and barrel are jointly formed of a single integral spring metal piece.

2. Apparatus according to claim 1 including an elongated terminal member integrally formed of the same spring metal piece and joined thereto so as to project outwardly from the outer barrel for providing a means of electrical contact to an external electrical conductor.

3. Apparatus according to claim 2 including a cap section integrally formed of the same spring metal piece and joined thereto between the spring section and the barrel section, and in which the terminal member is integrally joined to the cap member.

4. Apparatus according to claim 1 in which the tubular outer barrel is rounded to form an elongated closed cylindrical body, and in which the plunger member and spring section are both rounded and of tubular shape forming an integral compliant cylindrical member inside the cylindrical body of the barrel.

5. Apparatus according to claim 1 in which the spring section is formed from said spring metal piece initially comprising a thin, flat plate with a compliant spring section having long, narrow generally parallel slots alternately opening through opposite edges of the spring section to form a series of long narrow profile beams that individually deflect to cause the spring section to compress under an axial force, the narrow profile of the beams being formed by the slot adjacent the beam having a depth substantially greater than the thickness of the beams on opposite sides of the slot.

6. Apparatus according to claim 5 in which the thickness of each narrow beam is less than about 10% of the width of the spring section, the beams individually deflecting through shallow angles about respective pivot points alternating in position along the length of the spring section when the spring section is compressed by said axial force.

7. Apparatus according to claim 2 in which the tubular outer barrel is rounded to form an elongated closed cylindrical body, in which the plunger member and spring section are both rounded and of tubular shape forming an integral compliant cylindrical member inside the cylindrical body of the barrel, and in which the terminal member projects outwardly from an end of the barrel.

8. Apparatus according to claim 7 including a cap section integrally formed of the same spring metal piece between the spring section and the barrel and in which the cap section closes an end of the outer barrel from which the terminal member projects.

9. Apparatus according to claim 1 in which the one-piece contact probe comprises a test probe mounted in a test fixture for contact with a printed circuit board tested by automatic electronic test equipment to which the probe is electrically connected.

10. Apparatus according to claim 1 in which the barrel is generally cylindrical in shape with a narrow gap along one side so the barrel can provide a spring-biased retention means when placed in a hole of smaller diameter.

11. An electrical connector comprising a housing containing one or more passageways each containing a spring-biased electrical contact probe, in which a spring-biased plunger section of the probe protrudes from one end of the passageway and a terminal section of the probe projects from an opposite end of the passageway, the contact probe comprising a plunger member and a compliant spring section contained in and guided for spring-biased axial travel in a tubular outer barrel, in which the plunger member, spring section and barrel are jointly formed of a single integral spring metal piece.

12. Apparatus according to claim 11 including an elongated terminal member integrally formed of the same spring metal piece and joined thereto so as to project outwardly from the outer barrel for providing a means of electrical contact to an external electrical conductor.

13. Apparatus according to claim 12 including a cap section integrally formed of the same spring metal piece and joined thereto between the spring section and the barrel section, and in which the terminal member is integrally joined to the cap member and the cap member closes an end of the outer barrel.

14. Apparatus according to claim 11 in which the tubular outer barrel is rounded to form an elongated closed cylindrical body, and in which the plunger member and spring section are both rounded and of tubular shape forming an integral compliant cylindrical member inside the cylindrical body of the barrel.

15. Apparatus according to claim 11 in which the spring section is formed from said spring metal piece comprising a thin flat plate with a compliant spring section having long narrow generally parallel slots alternately opening through opposite edges of the spring section to form a series of long narrow profile beams that individually deflect to cause the spring section to compress under an axial force, the narrow profile of the beams being formed by the slot adjacent the beam having a depth substantially greater than the thickness of the beams on opposite sides of the slot with the beams individually deflecting through shallow angles about respective pivot points alternating in position along the length of the spring section when the spring section is compressed by said axial force.

16. Apparatus according to claim 11 in which the spring biased contact probe is electrically connected to a circuit on a printed circuit board.

17. A process for making a one-piece compliant electrical contact probe comprising the steps of:

forming a thin bendable spring metal piece having an initial profile defining a plunger section, a spring section and a barrel section formed in that order as an integral unit along the spring metal piece, bending the plunger section and the integral spring section from the initial profile into a generally tubular-shaped compliant plunger member, and bending the barrel section from the initial profile into a rounded profile and folding the barrel section back over the tubular-shaped compliant plunger member and finish-bending the barrel section to form a generally tubular outer barrel disposed around the tubular-shaped compliant plunger member, thereby forming a one-piece contact probe in which the compliant plunger member is contained in and guided for spring-biased axial travel in the tubular outer barrel.

18. The process according to claim 17 in which the compliant plunger member is formed by subjecting the plunger section and the spring section to bending by a progressive die process.

19. The process according to claim 17 in which the barrel section is partially rounded prior to folding it over and completing bending to form the finished tubular outer barrel.

20. The process according to claim 17 in which the spring section is formed from said spring metal piece which initially comprises a thin flat plate with a compliant spring section having long narrow generally parallel slots alternately opening through opposite edges of the spring section to form a series of long narrow profile beams that individually deflect to cause the spring section to compress under an axial force, the narrow profile of the beams being formed by the slot adjacent the beam having a depth substantially greater than the thickness of the beams on opposite sides of the slot with the beams individually deflecting through shallow angles about respective pivot points alternating in position along the length of the spring section when the spring section is compressed by said axial force.

21. The process according to claim 17 in which the initial profile comprises a generally flat spring metal piece in which the plunger section, spring section and barrel section are formed in that order along the spring metal piece.

22. The process according to claim 21 in which the initial profile is produced by metal stamping.

23. The process according to claim 21 including an elongated terminal member integrally formed of the same spring metal piece and joined thereto so as to project outwardly from the outer barrel for providing a means of electrical contact to an external electrical conductor.

24. The process according to claim 23 including a cap section integrally formed of the same spring metal piece and joined thereto between the spring section and the barrel section, in which the terminal member is integrally joined to the cap member, and including bending the metal piece so the cap section substantially closes an end of the outer barrel and the terminal member projects away from the body of the outer barrel.

25. The process according to claim 17 in which the barrel is formed with a narrow gap along one side.

* * * * *